(12) United States Patent
Shiobara et al.

(10) Patent No.: US 6,342,309 B1
(45) Date of Patent: Jan. 29, 2002

(54) EPOXY RESIN COMPOSITION AND SEMICONDUCTOR DEVICE

(75) Inventors: Toshio Shiobara; Shigeki Ino; Yasuo Kimura; Takayuki Aoki; Kazuhiro Arai; Hidenori Mizushima, all of Gunma-ken (JP)

(73) Assignee: Shin-Etsu Chemical Co., Ltd., Tokyo (JP)

( * ) Notice: Subject to any disclaimer, the term of this patent is extended or adjusted under 35 U.S.C. 154(b) by 0 days.

(21) Appl. No.: 09/640,874

(22) Filed: Aug. 18, 2000

(30) Foreign Application Priority Data

Aug. 19, 1999 (JP) .............................. 11-232199

(51) Int. Cl.$^7$ .......................... H01L 29/12; C08G 59/40
(52) U.S. Cl. ...................... 428/620; 428/413; 523/211
(58) Field of Search ................... 428/620, 413; 523/211

(56) References Cited

U.S. PATENT DOCUMENTS 6,248,454 B1 * 6/2001 Ikemura ..................... 428/620

FOREIGN PATENT DOCUMENTS

| JP | 1-242616 | * | 9/1989 | ............ C08G/59/40 |
| JP | 1-287131 | * | 11/1989 | ............ C08G/59/40 |
| JP | A8259666 | | 10/1996 | |

OTHER PUBLICATIONS

Virginia F. Wells, "Semiconductor International," pp. 214–218, (May 1989).

Nikkei Micordevices, pp. 66–67, (Jul. 1987).

* cited by examiner

Primary Examiner—Margaret G. Moore
Assistant Examiner—Michael J Feely

(57) ABSTRACT

An epoxy resin composition contains (A) an epoxy resin, (B) a curing agent, (C) an inorganic filler, and (D) catalyzed microcapsules containing an imidazole compound or organic phosphorus compound and having a mean particle size of 0.5–50 μm, the quantity of the catalyst leached out from the microcapsules in o-cresol at 30° C. for 15 minutes being at least 70% by weight of the entire catalyst quantity. The composition is suited for semiconductor package encapsulation since it has satisfactory catalyst latency, storage stability and cure.

4 Claims, No Drawings

EPOXY RESIN COMPOSITION AND SEMICONDUCTOR DEVICE

This invention relates to an epoxy resin composition having satisfactory catalyst latency, storage stability, adhesion to metals and hot strength, and a semiconductor device encapsulated with the cured product thereof.

BACKGROUND OF THE INVENTION

The semiconductor devices in use today are predominantly resin encapsulated diodes, transistors, integrated circuit (IC) chips, large scale integration (LSI) chips, and very large scale integration (VLSI) chips. Resin encapsulation is usually carried out with epoxy resin compositions because epoxy resins offer superior properties (e.g., moldability, adhesion, electrical characteristics, mechanical characteristics, and moisture resistance), compared with other thermosetting resins.

For cost reduction purposes, attempts to improve the package manufacturing cycle have been made in the semiconductor art. The epoxy resin compositions are required to be fast-curing. However, increasing the amount of catalyst to impart fast-curing tends to cause gold wire flow and short-filling during molding because of thickening and rapid curing. The increased amount of catalyst has another problem that the epoxy resin composition loses storage stability.

Microencapsulation is known in the art. JP-A 3-182520 discloses the microencapsulation of a curing agent in an epoxy resin composition. Conventional microcapsules, however, are difficult to provide a significantly increased reaction rate because the capsule shell is thick and the catalyst concentration is low. If the reaction rate is increased to improve the productivity, the composition is not so improved in storage stability. The microencapsulation technique has not reached the practical level.

SUMMARY OF THE INVENTION

An object of the invention is to provide a novel and improved epoxy resin composition comprising catalyzed microcapsules which are dispersible in resins and highly reactive so that the composition has satisfactory catalyst latency and storage stability as well as cured strength and adhesion, and a semiconductor device encapsulated with the cured product thereof.

The invention pertains to an epoxy resin composition comprising an epoxy resin, a curing agent, an inorganic filler, and a curing catalyst. We have found that by microencapsulating the curing catalyst, specifically forming microcapsules containing an imidazole compound or organic phosphorus compound as the curing catalyst and having a mean particle size of 0.5 to 50 μm such that the quantity of the catalyst leached out from the microcapsules in o-cresol at 30° C. for 15 minutes may be at least 70% by weight of the entire catalyst quantity, there is obtained an epoxy resin composition which finds a good compromise between curability and storage stability. The composition has satisfactory catalyst latency and storage stability while it is effectively curable upon molding and improved in cured strength and adhesion. The composition is suited for the encapsulation of semiconductor packages.

Accordingly, the invention provides an epoxy resin composition comprising (A) an epoxy resin, (B) a curing agent, (C) an inorganic filler, and (D) catalyzed microcapsules containing at least one of imidazole compounds and organic phosphorus compounds and having a mean particle size of 0.5 to 50 μm, the quantity of the catalyst leached out from the microcapsules in o-cresol at 30° C. for 15 minutes being at least 70% by weight of the entire catalyst quantity in the microcapsules. A semiconductor device encapsulated with the epoxy resin composition in the cured state is also contemplated herein.

DESCRIPTION OF THE PREFERRED EMBODIMENT

The epoxy resin (A) used in the epoxy resin composition of the invention is selected from a variety of epoxy resins including novolac-type epoxy resins such as phenolic novolac epoxy resins and cresol novolac epoxy resins, aralkyl type epoxy resins, biphenyl skeleton-containing aralkyl type epoxy resins, biphenyl type epoxy resins, heterocyclic epoxy resins, naphthalene ring-containing epoxy resins, bisphenol type epoxy resins such as bisphenol A epoxy resins and bisphenol F epoxy resins, and stilbene type epoxy resins, alone or in admixture of two or more.

Especially for the purpose of reducing the warpage of packages, polyfunctional epoxy resins are recommended. The preferred polyfunctional epoxy resins are of the following structure.

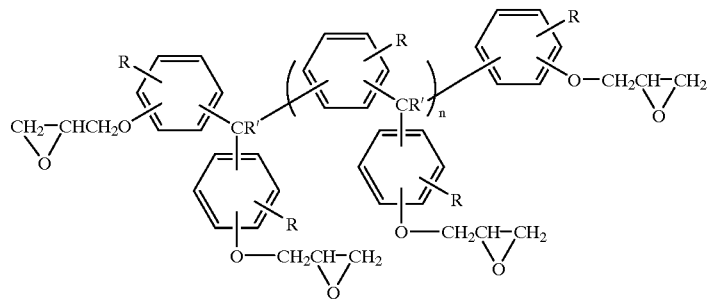

In the formula, R is hydrogen or a monovalent hydrocarbon group of 1 to 6 carbon atoms, as typified by alkyl groups including methyl, ethyl, propyl, isopropyl, n-butyl, isobutyl, tert-butyl, pentyl and hexyl. R' is hydrogen, methyl or ethyl, and preferably hydrogen. The letter n is an integer of 0 to 6. Of the polyfunctional epoxy resins, triphenolalkane type epoxy resins such as triphenolmethane type epoxy resins and triphenolpropane type epoxy resins are preferred.

It is also acceptable to use the polyfunctional epoxy resins in combination with the aforementioned epoxy resins.

The epoxy resins may be either liquid or solid and should preferably have a softening point of 50 to 120° C. and an epoxy equivalent of 100 to 400. Epoxy resins with a softening point of lower than 50° C. tend to form burrs and voids when molded and would result in cured products having a lower glass transition temperature whereas epoxy resins with a softening point of high than 120° C. would be too viscous to mold.

When the epoxy resins are used for the encapsulation of semiconductor devices, it is preferred that the content of hydrolyzable chlorine be up to 1,000 ppm, more preferably up to 500 ppm, and the contents of sodium and potassium be each up to 10 ppm. If semiconductor devices are encapsulated with compositions containing an epoxy resin with more than 1,000 ppm of hydrolyzable chlorine or more than 10 ppm of sodium or potassium, the encapsulated devices would experience deterioration of moisture resistance during long-term storage under hot humid conditions.

The curing agent (B) for the epoxy resins is preferably a phenolic resin having at least two phenolic hydroxyl groups per molecule. Exemplary curing agents include phenolic resins, for example, novolac-type phenolic resins such as phenolic novolac resins and cresol novolac resins; p-xylylene-modified novolac resins, m-xylylene-modified p-xylylene-modified novolac resins, o-xylylene-modified novolac resins, bisphenol type resins such as bisphenol A type resins and bisphenol F type resins, biphenyl type phenolic resins, resole type phenolic resins, phenolaralkyl resins, and triphenolalkane resins and polymerized products thereof; and naphthalene ring-bearing phenolic resins and dicyclopentadiene-modified phenolic resins.

Of these phenolic resins, phenolic novolac resins and triphenolalkane resins and polymers thereof are preferable from the consideration of heat resistance, package warpage and moldability.

Also amine curing agents and acid anhydride curing agents may be used alone or in combination with the phenolic resins.

The phenolic resin curing agents should preferably have a softening point of 60 to 150° C., especially 70 to 130° C. and a hydroxyl equivalent of 90 to 250. When the phenolic resins are used for the encapsulation of semiconductor devices, it is preferred that the contents of sodium and potassium be each up to 10 ppm. If semiconductor devices are encapsulated with compositions containing a phenolic resin with more than 10 ppm of sodium or potassium, the encapsulated devices would experience accelerated deterioration of moisture resistance during long-term storage under hot humid conditions.

The curing agent may be blended in any desired amount insofar as the epoxy resin can be effectively cured. When a phenolic resin is used as the curing agent, it is preferably blended in such amounts that the molar ratio of phenolic hydroxyl groups in the phenolic resin to epoxy groups in the epoxy resin may range from 0.5 to 1.5, especially from 0.8 to 1.2.

The inorganic filler (C) is selected from fillers commonly used in epoxy resin compositions. The inorganic filler is blended in order to reduce the coefficient of expansion of encapsulants for reducing the stress applied to semiconductor devices. Typical of the inorganic filler are fused silica in ground or spherical form and crystalline silica. Alumina, silicon nitride, aluminum nitride, and other fillers may also be used.

To achieve a good compromise between reduced expansion of cured products and moldability of compositions, it is recommended to use a blend of fillers in spherical and ground forms or only a filler in spherical form. The inorganic filler is preferably used after it is surface treated with silane coupling agents.

The inorganic filler preferably has a mean particle size of 1 to 40 µm, more preferably 5 to 30 µm. The mean particle size as used herein can be determined, for example, as the weight average (or median diameter) in the particle size distribution as measured by the laser light diffraction method.

The inorganic filler is blended in amounts of about 100 to 1,000 parts, preferably about 250 to 1,000 parts, and more preferably about 350 to 900 parts by weight per 100 lo parts by weight of the epoxy resin (A) and curing agent (B) combined. The preferred loading of inorganic filler is at least 70%, especially at least 75% by weight of the entire composition. Epoxy resin compositions loaded with less than 70% by weight of the inorganic filler may have a high coefficient of expansion, causing greater stresses to be applied to semiconductor devices and hence, deterioration of the device characteristics. The upper limit of filler loading is usually 92% by weight.

In the epoxy resin composition of the invention, catalyzed microcapsules (D) are blended as the curing catalyst. The catalyzed microcapsules should contain at least one of imidazole compounds and organic phosphorus compounds, have a mean particle size of 0.5 to 50 µm, and satisfy that the quantity of the catalyst leached out from the microcapsules in o-cresol at 30° C. for 15 minutes is at least 70% by weight of the entire catalyst quantity in the microcapsules.

The curing catalyst to be contained in microcapsules is selected from imidazole compounds and organic phosphorus compounds and mixtures thereof.

Useful imidazole compounds are of the following general formula (1).

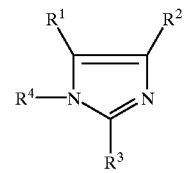

(1)

In the formula, $R^1$ and $R^2$ are independently hydrogen or substituted or unsubstituted monovalent hydrocarbon groups of 1 to 12 carbon atoms, preferably 1 to 6 carbon atoms, for example, alkyl, substituted alkyl and aryl groups, such as methyl, ethyl, hydroxymethyl and phenyl. $R^3$ is a substituted or unsubstituted monovalent hydrocarbon group of 1 to 12 carbon atoms, preferably 1 to 6 carbon atoms, for example, alkyl, alkenyl and aryl groups, such as methyl, ethyl, phenyl and allyl. $R^4$ is hydrogen or a substituted or unsubstituted monovalent hydrocarbon group of 1 to 12 carbon atoms, preferably 1 to 6 carbon atoms, for example, alkyl, substituted alkyl and aralkyl groups, such as methyl, ethyl, cyanoethyl and benzyl, or a group represented by the following formula (2). Exemplary substituted monovalent hydrocarbon groups are hydroxy and cyano-substituted ones.

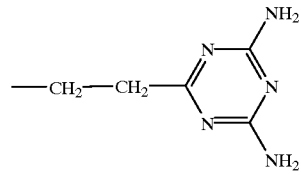

(2)

Examples of the imidazole compound include 2-methylimidazole, 2-ethyl-4-methylimidazole, 2-phenylimidazole, 1-benzyl-2-phenylimidazole, 1-cyanoethyl-2-methylimidazole, 1-cyanoethyl-2-undecylimidazole, 1-benzyl-2-methylimidazole, 2-phenyl-4,5-dihydroxymethylimidazole, 2-allyl-4,5-diphenylimidazole, 2,4-diamino-6-[2'-methylimidazolyl-(1)']-ethyl-S-triazine, 2,4-diamino-6-[2'-ethyl-4'-methylimidazolyl-(1)']-ethyl-S-triazine, 2,4-diamino-6-[2'-methylimidazolyl-(1)']-ethyl-S-triazine isocyanuric acid adduct, and 2-phenyl-4-methyl-5-hydroxymethylimidazole.

Examples of the organic phosphorus compound include organophosphines, typically triorganophosphines such as triphenylphosphine, tributylphosphine, tri(p-methylphenyl)phosphine, tri(nonylphenyl)phosphine, and diphenyltolylphosphine; a salt of a triorganophosphine with a triorganoboran such as triphenylphosphine-triphenylboran; and a salt of a tetraorganophosphonium with a tetraorganoborate such as tetraphenylphosphonium tetraphenylborate. Of these, phosphorus compounds of the following general formula (3) are preferred.

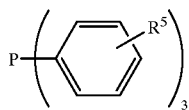

(3)

Herein, $R^5$ is hydrogen, or an alkyl or alkoxy group of 1 to 4 carbon atoms. Exemplary alkyl groups are methyl, ethyl, propyl, isopropyl, butyl, isobutyl and tert-butyl. Exemplary alkoxy groups are methoxy and ethoxy. Preferably $R^5$ is hydrogen or methyl.

Examples of the compound of formula (3) are given below.

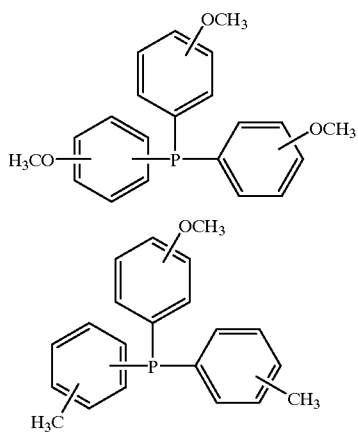

The microcapsules are obtained by microencapsulating the curing catalyst with suitable polymers. Included are polymers of (meth)acrylic monomers, for example, alkyl esters of 1 to 8 carbon atoms and similar alkyl esters whose alkyl group has a substituent such as allyl, such as acrylates, itaconates, methacrylates, and crotonates; monofunctional olefinic (or vinyl) monomers such as styrene, α-methylstyrene, acrylonitrile, methacrylonitrile, and vinyl acetate; and polyfunctional olefinic (or vinyl) monomers such as ethylene glycol di(meth)acrylate, polyethylene glycol di(meth)acrylate, divinyl benzene, bisphenol A di(meth)acrylate, and methylene bis(meth)acrylamide. Of these, polymers of (meth)acrylate monomers are preferred.

Any desired method may be employed in preparing microcapsules containing the curing catalyst in the form of an imidazole compound or organic phosphorus compound as mentioned above. To manufacture microcapsules having a high roundness in high yields, any suitable one of well-known suspension polymerization or emulsion polymerization methods may be used.

To manufacture high concentration microcapsules from a commonly available catalyst, about 10 to 200 parts, desirably about 10 to 100 parts, and more desirably about 20 to 50 parts by weight of the monomer(s) may be used per 10 parts by weight of the curing catalyst. With less than 10 parts of the monomer, it may become difficult to impart latency. More than 200 parts of the monomer corresponds to a lower concentration of the catalyst, which may require to increase the amount of the catalyzed microcapsules for achieving satisfactory cure, leading to an economical disadvantage. In other words, the concentration of the curing catalyst in the microcapsules may be about 5 to 50% by weight, preferably about 9 to 50% by weight, more preferably 17 to 33% by weight.

In this way, microcapsules are formed to a mean particle size of 0.5 to 50 μm, desirably 3 to 25 μm. Microcapsules with a mean particle size of less than 0.5 μm have the risk that a composition having a large amount of such microcapsules blended therein has an increased viscosity and the catalysis latency becomes insufficient. Microcapsules with a mean particle size of more than 50 μm can cause gate clogging during molding.

Additionally, the microcapsules should have the following release action. In a leaching test, 1 g of the curing catalyst-containing microcapsules is mixed with 30 g of o-cresol, the mixture is held at 30° C. for 15 minutes, and the quantity of the leached-out catalyst is determined by gas chromatography. The quantity of the leached-out catalyst is at least 70% by weight (i.e., 70 to 100% by weight) based on the entire quantity of the catalyst contained in the microcapsules. If the leach-out quantity is less than 70% in a 30° C./15 min cresol leaching test, molding of the epoxy resin composition over semiconductor devices may require a molding time of more than one minute at 175° C., leading to a low productivity. A leach-out quantity of at least 75% by weight (i.e., 75 to 100% by weight) is more desirable.

In the epoxy resin composition, the curing catalyst-containing microcapsules (D) are desirably blended in an amount of about 0.5 to 15 parts, more desirably about 1 to 10 parts by weight per 100 parts by weight of components (A) and (B) combined. Less than 0.5 part of the microcapsules may fail to provide satisfactory cure. More than 15 parts of the microcapsules ensure satisfactory cure, but increase the cost.

In the epoxy resin composition, the conventional curing catalyst (curing accelerator) which is not microcapsulated may be blended in combination with the curing catalyst-containing microcapsules. In this case, the weight ratio (B)/(A) of (B) the curing catalyst which is not microcapsulated and (A) the curing catalyst-containing microcapusules is preferably 0 to 0.5, preferably 0 to 0.2, more preferably 0 to 0.1.

For imparting flexibility or toughness or adhesiveness to the cured product of the epoxy resin composition, any of silicone-modified copolymers, various organic synthetic rubbers, thermoplastic resins such as styrene-butadiene-methyl methacrylate copolymers and styrene-ethylene-butene-styrene copolymers, silicone gel, and silicone rubber in powder form may be added to the inventive composition. The inorganic filler may be surface treated with two-part type silicone rubber or silicone gel. It is understood that the above-mentioned silicone-modified copolymers and styrene-butadiene-methyl methacrylate copolymers are effective for reducing stresses in the epoxy resin. The amount of such a silicone-modified copolymer and/or thermoplastic resin serving as the stress-reducing agent is preferably 0 to 10%, more preferably 0.2 to 5% by weight of the entire epoxy resin composition. More than 10% may detract from mechanical strength.

In the inventive composition, there may also be blended colorants (e.g., carbon black), flame retardants (e.g., brominated epoxy resins and antimony trioxide), parting agents, and coupling agents.

The epoxy resin composition of the invention is prepared as a molding material by blending the epoxy resin, curing agent, inorganic filler, curing catalyst-containing microcapsules, and other additives in a predetermined proportion, uniformly mixing them in a dry mixer or the like, melt kneading the mixture in a hot roll mill, kneader or extruder, followed by cooling for solidification and grinding to a suitable size.

The epoxy resin composition containing the catalyzed microcapsules is effectively utilized in encapsulating semiconductor devices. The most common encapsulation process is low pressure transfer molding. The molding temperature is usually about 160 to 190° C.

EXAMPLE

Examples of the invention are given below by way of illustration and not by way of limitation.

Examples and Comparative Examples

Epoxy resin compositions were prepared in a conventional manner using the components shown in Tables 1 to 3. They were examined by the following tests, with the results shown in Tables 1 to 3.

(1) Spiral flow

Measured while molding the composition at 175° C. and 70 kgf/cm².

(2) Gel time Measured at 175° C.

(3) Hot hardness

Each epoxy resin composition was molded and cured at 175° C. for 40 seconds into a part of 100 mm×10 mm×4 mm. Immediately thereafter, the mold was opened and the hardness of the molded part was measured by a Barcol hardness meter.

(4) Melt viscosity

The melt viscosity was measured at 175° C. with a constant-load orifice-type flow testing apparatus of the kind known in Japan as a Koka-type flow tester, using a nozzle having a diameter of 1 mm.

(5) Storage stability

Each epoxy resin composition was placed in a closed container and held at 25° C. for 120 hours. The spiral flow was measured again. A retentivity (%) of spiral flow was calculated from the initial and aged values and used as an index of storage stability.

(6) Molding on QFP Package

Mini-tablets were prepared from each compound, and molded over QFP packages of 14 mm×14 mm×2.7 mm under the following conditions for examining moldability.

Molding conditions:

Molding temperature: 175° C.

Molding pressure: 70 kgf/cm²

Molding time: 40 seconds

Preheating time: 5 seconds

TABLE 1

| Components (pbw) | E1 | E2 | E3 | E4 | E5 |
|---|---|---|---|---|---|
| YX4000 | 47.1 | 47.1 | 47.1 | 47.1 | 47.1 |
| MH7800 | 43.0 | 43.0 | 43.0 | 43.0 | 43.0 |
| Spherical fused silica (mean particle size 15 μm) | 890 | 890 | 890 | 890 | 890 |
| Carnauba wax | 2.8 | 2.8 | 2.8 | 2.8 | 2.8 |
| Carbon black | 1.8 | 1.8 | 1.8 | 1.8 | 1.8 |
| KBM403 | 2.0 | 2.0 | 2.0 | 2.0 | 2.0 |
| Microcapsule A | 5.0 | — | — | — | 4.0 |
| Microcapsule B | — | 7.5 | — | — | — |
| Microcapsule C | — | — | 5.0 | — | — |
| Microcapsule D | — | — | — | 10.0 | — |
| TPP | — | — | — | — | 0.3 |
| Spiral flow (cm) | 120 | 115 | 118 | 82 | 112 |
| Gel time (sec) | 16 | 15 | 15 | 19 | 13 |
| Hot hardness (Barcol) | 88 | 86 | 89 | 58 | 92 |
| Melt viscosity (poise) | 80 | 75 | 82 | 135 | 88 |
| Retentivity (%) of spiral flow after aging | 93 | 95 | 94 | 98 | 90 |
| Moldability on QFP package | good | good | good | good | good |

TABLE 2

| Components (pbw) | CE1 | CE2 | CE3 | CE4 |
|---|---|---|---|---|
| YX4000 | 47.1 | 47.1 | 47.1 | 47.1 |
| MH7800 | 43.0 | 43.0 | 43.0 | 43.0 |
| Spherical fused silica (mean particle size 15 μm) | 890 | 890 | 890 | 890 |
| Carnauba wax | 2.8 | 2.8 | 2.8 | 2.8 |
| Carbon black | 1.8 | 1.8 | 1.8 | 1.8 |
| KBM403 | 2.0 | 2.0 | 2.0 | 2.0 |
| Microcapsule E | 5.0 | — | — | — |
| Microcapsule F | — | 7.5 | — | — |
| Microcapsule G | — | — | 6.0 | — |
| TPP | — | — | — | 0.7 |
| Spiral flow (cm) | 162 | 151 | 145 | 115 |
| Gel time (sec) | 21 | 23 | 26 | 14 |
| Hot hardness (Barcol) | 15 | 28 | 39 | 89 |
| Melt viscosity (poise) | 45 | 58 | 61 | 120 |
| Retentivity (%) of spiral flow after aging | 99 | 98 | 96 | 56 |
| Moldability on QFP package | short-cure on package and gull leads | | | good |

TABLE 3

| Components (pbw) | E6 | E7 | CE5 |
|---|---|---|---|
| EOCN1020 | 65 | 65 | 65 |
| TD2093 | 30 | 30 | 30 |
| BREN-S | 5 | 5 | 5 |
| Spherical fused silica (mean particle size 15 μm) | 450 | 450 | 450 |
| Antimony trioxide | 5 | 5 | 5 |
| Carnauba wax | 1.5 | 1.5 | 1.5 |
| Carbon black | 1.5 | 1.5 | 1.5 |
| KBM403 | 1.5 | 1.5 | 1.5 |
| Microcapsule A | 4.0 | — | — |
| Microcapsule D | — | 13.0 | — |
| Microcapsule G | — | — | 6.0 |
| TPP | 0.3 | — | 0.3 |
| Spiral flow (cm) | 85 | 80 | 103 |
| Gel time (sec) | 14 | 17 | 21 |
| Hot hardness (Barcol) | 85 | 63 | 47 |
| Melt viscosity (poise) | 180 | 167 | 129 |
| Retentivity (%) of spiral flow after aging | 93 | 98 | 94 |
| Moldability on QFP package | good | good | short-cure on package and gull leads |

XY4000: Yuka Shell K.K.

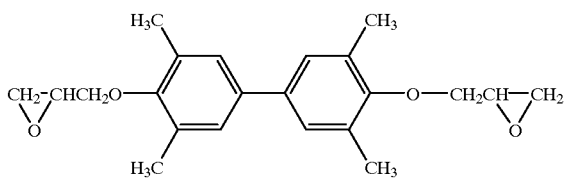

MH7800: Meiwa Chemicals K.K.

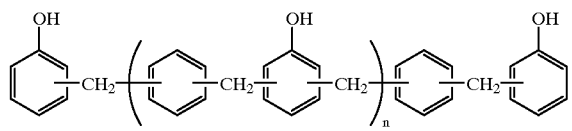

(n is an integer of 0 to 5.)

EOCN1020: cresol novolac type epoxy resin, Nippon Kayaku K.K.

TD2093: phenol novolac resin, Dai-Nippon Ink & Chemicals K.K.

BREN-S: brominated phenol novolak type epoxy resin, Nippon Kayaku K.K.

KBM403: γ-glycidoxypropyltrimethoxysilane, Shin-Etsu Chemical Co., Ltd.

TPP: triphenylphosphine, Hokko Chemical K.K. Microcapsules A-G:

TABLE 4

| Microcapsule | A | B | C | D | E | F | G |
|---|---|---|---|---|---|---|---|
| Catalyst | TPP | TPP | TPP | 2E4MZ | TPP | TPP | 2E4MZ |
| Capsule base | MM | MM/St | MM | MM | MM | MM/St | MM |
| Catalyst content (wt %) | 30 | 20 | 30 | 9 | 30 | 20 | 25 |
| Leach-out (%) | 85 | 87 | 75 | 90 | 56 | 62 | 67 |
| Mean particle size (μm) | 10 | 8 | 12 | 9 | 12 | 11 | 14 |

TABLE 4-continued

| Microcapsule | A | B | C | D | E | F | G |
|---|---|---|---|---|---|---|---|

TPP: triphenylphosphine
2E4MZ: 2-ethyl-4-methylimidazole
MM: methyl methacrylate
St: styrene
Leach-out: the quantity of the catalyst leached out of the microcapsules in o-cresol at 30° C. for 15 minutes There has been described an epoxy resin composition which has satisfactory cure, catalyst latency, and storage stability and is suited for semiconductor encapsulation.

Japanese Patent Application No. 11-232199 is incorporated herein by reference.

Although some preferred embodiments have been described, many modifications and variations may be made thereto in light of the above teachings. It is therefore to be understood that the invention may be practiced otherwise than as specifically described without departing from the scope of the appended claims.

What is claimed is:

1. An epoxy resin composition comprising
   (A) an epoxy resin,
   (B) a curing agent,
   (C) an inorganic filler, and
   (D) catalyzed microcapsules containing at least one of imidazole compounds and organic phosphorus compounds and having a mean particle size of 0.5 to 50 μm, the quantity of the catalyst leached out from the microcapsules in o-cresol at 30° C. for 15 minutes being at least 70% by weight of the entire catalyst quantity in the microcapsules.

2. The epoxy resin composition of claim 1 further comprising (E) a curing catalyst which is not microencapsulated.

3. A semiconductor device encapsulated with the epoxy resin composition of claim 1.

4. The semiconductor device according to claim 3, wherein said device is encapsulated with the epoxy resin composition in the cured state.

* * * * *